Figure 1:
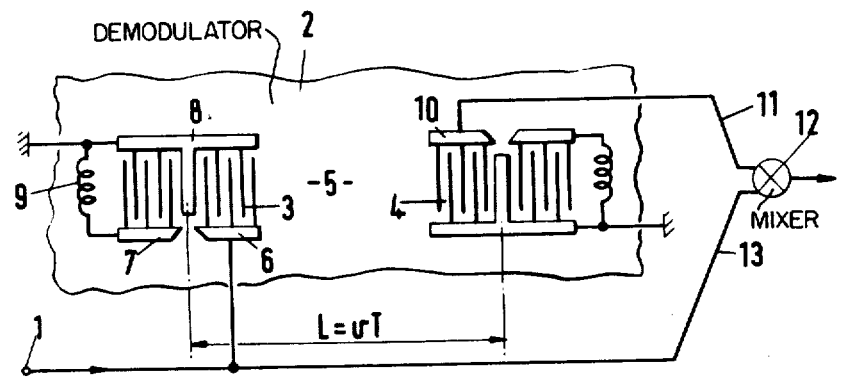

United States Patent

Henaff et al.

[11] 4,054,841
[45] Oct. 18, 1977

[54] DIFFERENTIAL DEMODULATORS USING SURFACE ELASTIC WAVE DEVICES

[76] Inventors: Jeannine Le Goff Henaff, 3ter, Place Marquis; Gilbert Lainey, 7, rue Hebert; Michel France Carel, 3, rue des Volontaires, all of, Clamart, France, 92140

[21] Appl. No.: 686,387
[22] Filed: May 14, 1976

[30] Foreign Application Priority Data
May 29, 1975 France .................. 75.17351

[51] Int. Cl.² .................................. H03D 3/16
[52] U.S. Cl. .................. 329/118; 325/349; 325/487; 329/137; 329/145; 333/30 R; 333/72
[58] Field of Search ............. 329/117, 118, 119, 137, 329/140, 145; 325/349, 487; 333/30 R, 72

[56] References Cited
U.S. PATENT DOCUMENTS

| | | | |
|---|---|---|---|
| 3,936,751 | 2/1976 | Holmes et al. | 329/119 X |
| 3,987,367 | 10/1976 | Hartemann | 329/118 |

*Primary Examiner*—Siegfried H. Grimm

[57] ABSTRACT

A differential demodulator of phase-modulated digital data trains includes a device, for example a piezoelectric substrate, which transmits acoustic surface waves and includes comb-shaped input and output transducers on the substrate. The delay in the transmission of acoustic surface waves between the input and output transducers is used in the process of demodulating the phase modulated digital data trains.

7 Claims, 9 Drawing Figures

EQUIVALENT CIRCUIT FOR FIG. 2

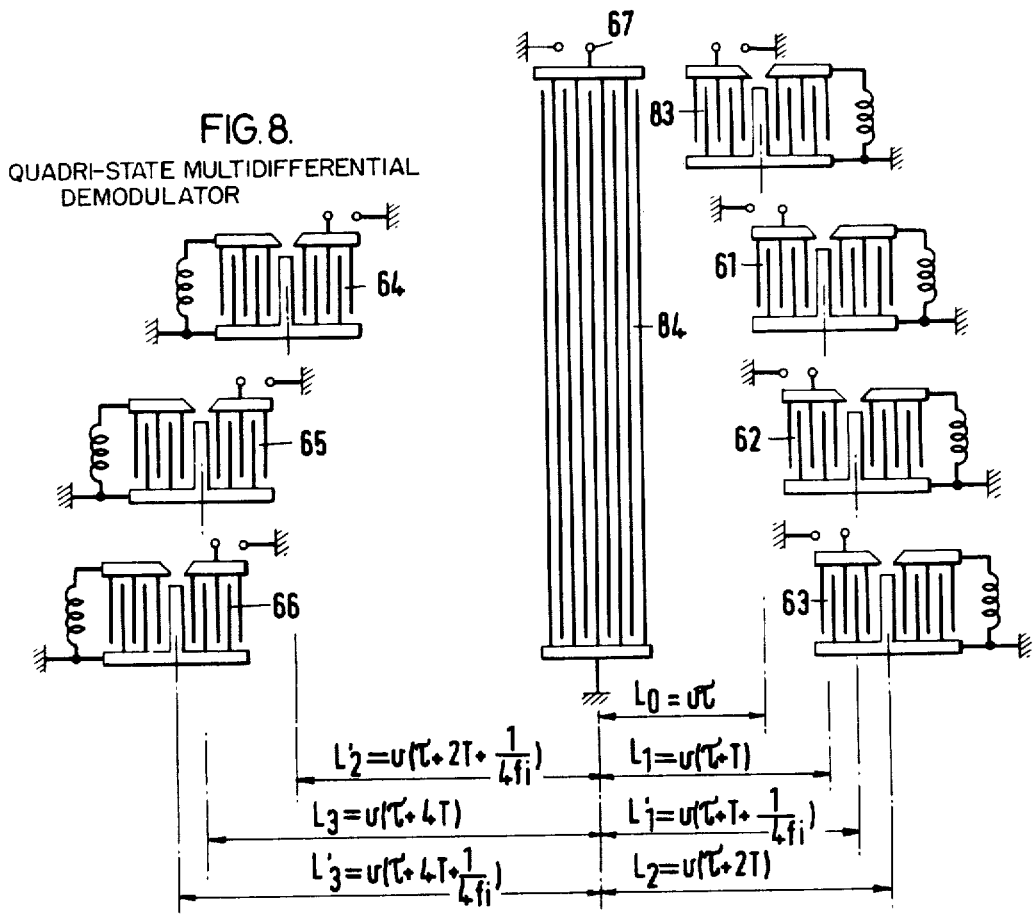
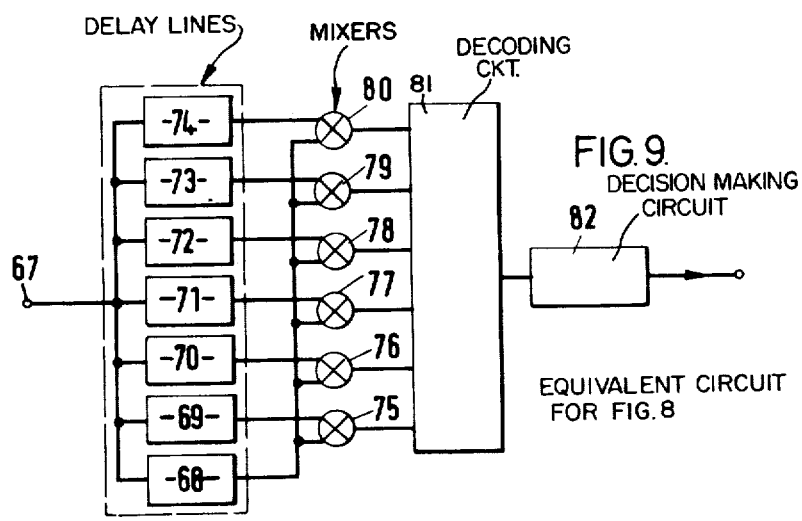

DIFFERENTIAL DEMODULATORS USING SURFACE ELASTIC WAVE DEVICES

The present invention relates to differential demodulators of phase-modulated digital data trains which include delay lines constituted by acoustic surface wave devices.

Acoustic surface wave devices use an input transducer in the form of a comb fed by electrical signals, in order to excite surface waves on a piezoelectric substrate. The acoustic waves are picked up by a comb-shaped output transducer which delivers electrical signals. The speed of propagation of the surface waves is relatively low. This has already resulted in the suggestion that acoustic wave devices could be used as delay lines.

There are in fact two known methods of demodulating waves that have been phase-shift-modulated by digital trains. The first method consists of a coherent demodulation followed by transcoding and the second method involves differential demodulation. Coherent demodulation requires regeneration of a phase reference from the signal to be demodulated. In differential demodulation, the demodulating and transcoding are done simultaneously by comparison of the phase of the carrier of the train to be domodulated, at moments t and T, T being the duration of a binary element of the train. A differential demodulator therefore essentially includes a delay line. The delay constant is equal to T. At the input of the delay line, the carrier is applied, which is phase-shift-modulated by the digital train. The modulated carrier is picked up at the output and multiplied by the modulated input carrier in a mixer. The output of the modulator delivers the domodulated digital data.

Up to the present, differential demodulators of this type have been used only for digital trains having a high speed, in the order of several tens of megabits per second. Below ten megabits per second, use is only made, in practice, of coherent demodulators which, as mentioned above, are more complicated. It is moreover easy to understand why it was not reasonably possible to use differential demodulators at low speed, because the delay lines consisted of coaxial cables. A coaxial cable makes it possible to operate in the same range of carrier frequencies as delay lines with elastic surface waves, but it is not suitable, in practice, for low speeds, from the point of view of attenuation and bulk. In fact, the delay produced by a coaxial cable is only about 5 ns per meter. For instance, 10 meters of coaxial cable produce a delay of 50 ns, which corresponds to a repetition frequency of 20 MHz for a dual-state phase-modulation digital train. In order to treat a digital train with a repetition frequency of 2 MHz, it would be necessary to use 100 meters of cable, which results in a prohibitive size and an attenuation of 10 dB for a carrier frequency of 70 MHz.

An object of the present invention is to produce a differential demodulator of waves which are phase-shift-modulated by low-speed digital trains, which does not have the above-mentioned drawback of bulk and attenuation.

Another object of the present invention is to produce a differential demodulator of waves which have undergone pluri-state phase-shift-modulation by digital trains, reducing the number of components.

According to one aspect of the invention, there is a differential demodulator of waves which are phase-shift-modulated by digital trains. The demodulator includes an input, an elastic-surface-wave transmission device and an input transducer. The input transducer is connected to the input of the demodulator. An output transducer is connected to one input of a mixer having two inputs and an output. The second input of the mixer is connected to the input of the demodulator. The output of the mixer is connected, directly or indirectly, to the output of the demodulator. The length of the path between an input transducer and an output transducer is determined by the repetition frequency of the train.

According to another aspect of the invention, there is a differential demodulator of waves which have undergone dual-state phase-shift-modulation by a digital train. The demodulator includes an input, an elastic-surface-wave transmission device having first and second paths, and an input transducer. The input transducer is connected to the input of the demodulator and projects surface waves along the first and second paths. A first output transducer is associated with the first path and connected to one input of a mixer having first and second inputs and an output. A second output transducer is associated with the second path and connected to the second input of the mixer. The difference in length between the first and second paths is dependent upon the repetition frequency of the train.

According to yet another aspect of the invention there is a differential demodulator of waves which have undergone quadri-state phase-shift-modulation by a digital train. The demodulator includes an input, an elastic-surface-wave device having first, second and third paths, and an input transducer. The input transducer is connected to the input of the demodulator and projects surface waves along the three paths. A first output transducer associated with the first path. A first mixer has first and second inputs. A second mixer has first and second inputs. The first input of the first mixer and the first input of the second mixer are connected to the first output transducer. A second transducer associated with the second path. The second transducer is connected to the second input of the first mixer and a third transducer is associated with the third path. The third transducer is connected to the second input of the second mixer. The first mixer delivers the even train of digital data and the second mixer delivers the odd train of digital data. The difference in length between the first and second paths is determined according to the repetition frequency of the train. The difference in length between the second and third paths is related to a quarter of the inverse of the carrier frequency of the modulated wave.

Figure 2:
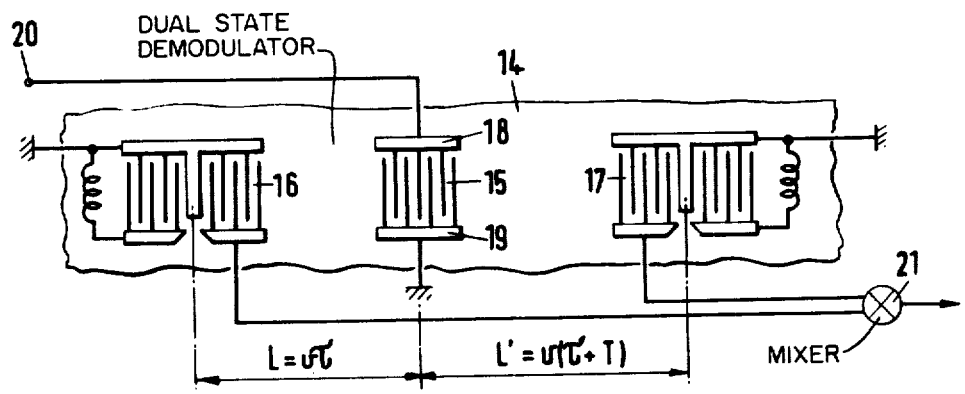
Figure 3:
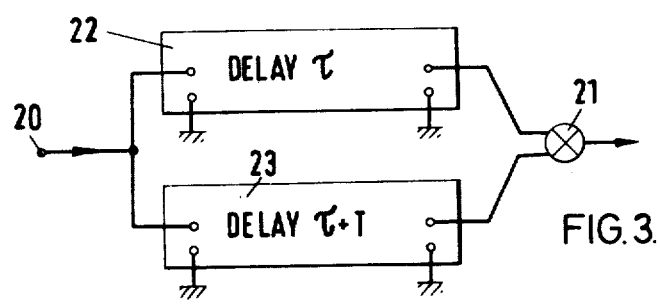
Figure 4:
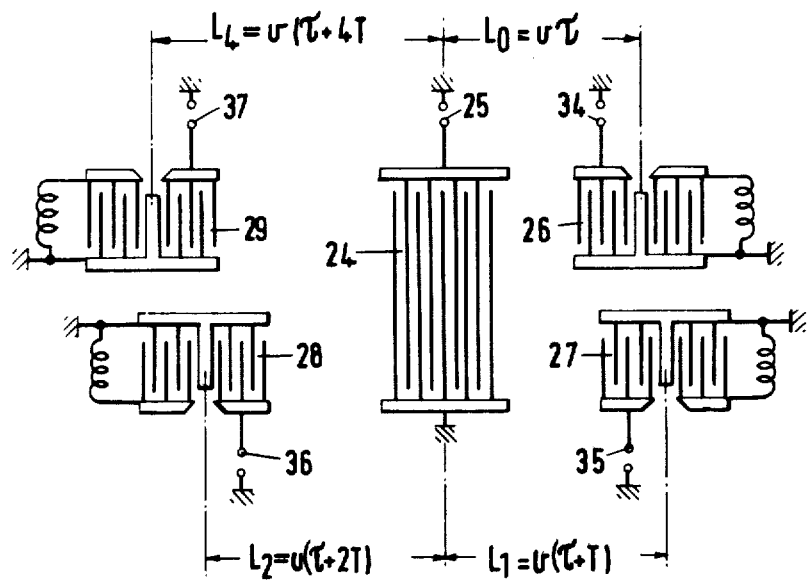
Figure 5:
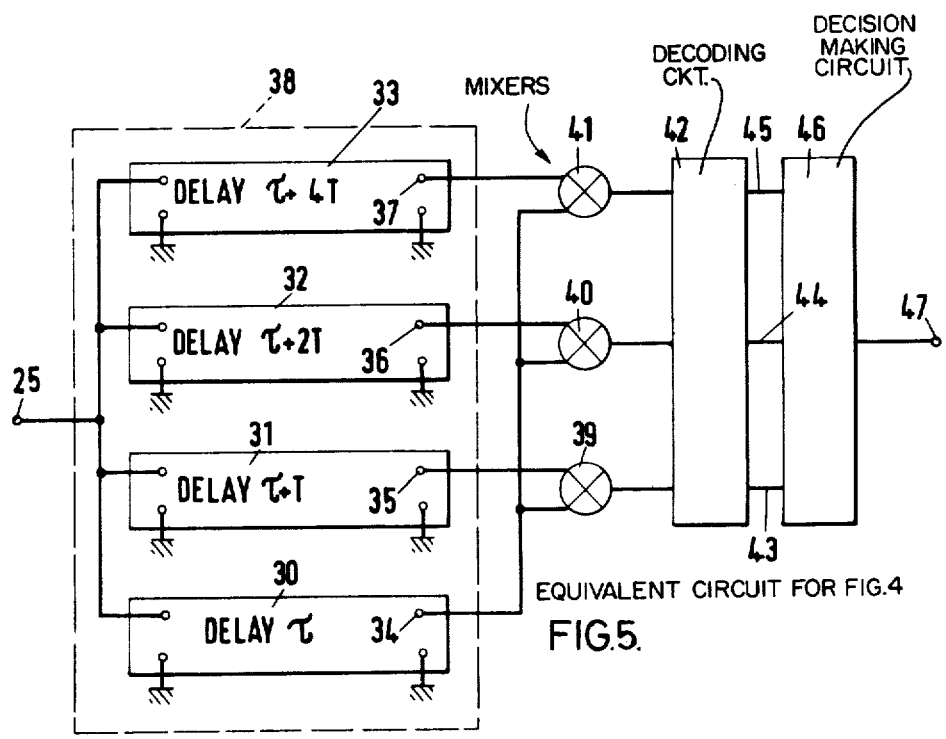
Figure 6:
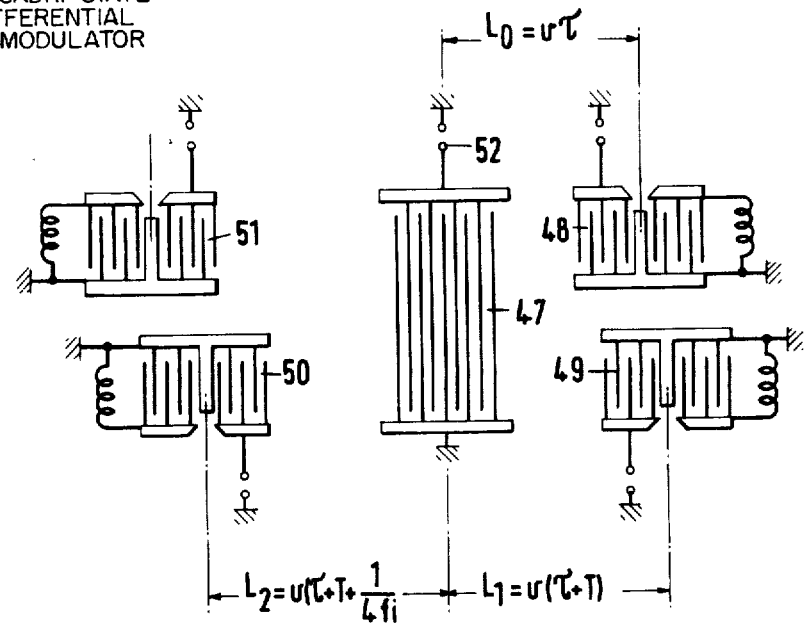
Figure 7:
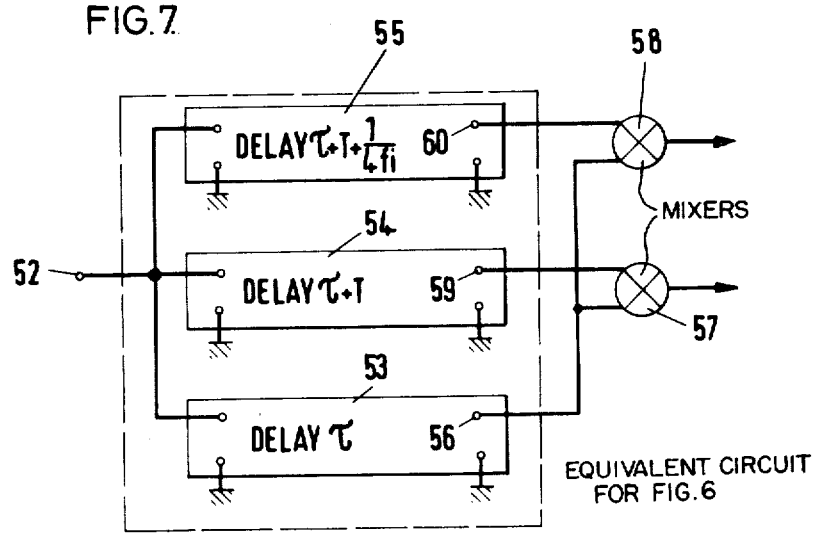

Embodiments of the invention will now be described, by way of example, with reference to the accompanying drawings, in which:

FIG. 1 is a schematic view of a demodulator of waves which have undergone dual state phase-shift-modulation by a digital train, FIG. 2 is a schematic view of a variant of the demodulator shown in FIG. 1, FIG. 3 is the equivalent circuit diagram of the demodulator in FIG. 2, FIG. 4 is a schematic view of an acoustic-surface-wave device usable in the multi-differential variant of the demodulator shown in FIG. 2, FIG. 5 is an equivalent circuit diagram of a demodulator containing the device shown in FIG. 4, FIG. 6 is a schematic view of an acoustic-surface-wave device usable in a demodulator of waves which have undergone quadri-state phase-shift modulation, FIG. 7 is the equivalent circuit diagram of a demodulator containing the device shown in FIG. 6, FIG. 8 is a schematic view of an acoustic-surface-wave device usable in a differential demodulator of waves which have undergone quadri-state phase-shift modulation, and FIG. 9 is the equivalent circuit diagram of a demodulator containing the device shown in FIG. 8.

In FIG. 1, there is shown a demodulator which receives, via an input 1, signals to be demodulated. Those signals are in the form of a carrier which is phase-shift-modulated by a train of digital data signals by a dual-state modulation. The demodulator includes an acoustic-surface-wave device which has a piezoelectric substrate 2 on which there are placed, in a classical manner, an input transducer 3 and an output transducer 4 which, between them, define a propagation path 5 for acoustic waves.

The transducer 3 has three comb-shaped electrodes 6, 7 and 8. The electrode 6 is connected to the signal input 1 and its comb is interlaced with the right-hand part of the comb of the electrode 8, which is connected to the ground of the substrate 2. The electrode 7 is connected to one terminal of an inductor 9, the other terminal of which is connected to ground, and its comb is interlaced with the left-hand part of the electrode 8. The teeth of the combs of the electrodes 6 and 7 are symmetrical with respect to a thicker middle-tooth of the comb of the electrode 8. Thus constituted, the transducer 3 is unidirectional, that is, it projects surface waves only towards the transducer 4.

The transducer 4 is identical with the transducer 3. It is preferably positioned symmetrically with respect to the median line of the path 5 in order to ensure better decoupling between its output electrode 10 and the input electrode 6 of the transducer 3.

The output electrode 10 is connected to a first input 11 of a mixer 12, whose second input 13 is connected to the input 1. The output of the mixer 12 constitutes the output of the demodulator.

A distance L between the comparatively thick middle teeth of the transducers 3 and 4 is such that $L = vT$, where $v$ is the speed of propagation of the acoustic surface waves on the substrate 2 and $T$ is equal to the inverse of the repetition frequency of a train of digital data applied to the input 1, that is, equal to the duration of a binary element of that train. Consequently, each binary element is subject, between the transducers 3 and 4, to a delay equal to its duration. At the inputs 13 and 11 of the mixer 12 there are, respectively, a binary element connected to the input 1 and a preceding binary element. The mixer 12 then restores the initial data train, before modulation.

FIG. 2 shows another example of a demodulator of waves modulated by dual-state phase-shift modulation. The demodulator is constituted by an acoustic-wave device including a piezoelectric substrate 14 on which there are an input transducer 15 and two output transducers 16 and 17. The transducers 16 and 17 are identical, in their design, with the transducer 3 shown in FIG. 1. The transducer 15 is bidirectional and has two electrodes 18 and 19 in the form of overlapping combs. The comb 18 is connected to an input 20, to which the digital train is applied, while the comb 19 is connected to ground. The transducer 15 radiates symmetrically towards the transducers 16 and 17.

A distance L between the middle teeth of the transducers 15 and 16 is such that $L = v\tau$, while a distance L' between the middle teeth of the transducers 15 and 17 is such that $L' = v(\tau + T)$, where $v$ is the speed of propagation of the waves, T is the inverse of the repetition frequency of the train applied to the input 20, and $\tau$ is an arbitrary time corresponding to the arbitrarily-chosen distance L.

The output electrode of the transducer 16 is connected to one input of a mixer 21, which is similar to the mixer 12. The output electrode of the transducer 17 is connected to the other input of the mixer 21, the output of which constitutes the output of the demodulator.

FIG. 3 shows the equivalent electrical circuit diagram of the demodulator of FIG. 2, with the input 20 feeding two delay lines 22 and 23, whose outputs are respectively connected to the inputs of the mixer 21.

The delay $\tau$ of the line 22 corresponds to the propagation time of the acoustic waves between the transducers 15 and 16, while the delay $(\tau + T)$ of the line 23 corresponds to the propagation time between the transducers 15 and 17. Consequently, a binary element and the preceding binary element in the train are simultaneously present at the inputs of the mixer 21, as in the arrangement of FIG. 1.

In practice, the variant shown in FIG. 2 has the advantage over that shown in FIG. 1 of giving better decoupling between the input and the output, particularly if T is small. For in fact, in the case shown in FIG. 1, the transducers 3 and 4 would have to be positioned relatively close to each other, with the risk of a not-negligible direct radiation between them. On the other hand, in the arrangement of FIG. 2, it is possible to choose a value of $\tau$, that is a value of L, which is large enough to reduce the direct radiation between the transducer 15, on the one hand, and the transducers 16 and 17, on the other.

FIG. 4 shows an example of a multi-differential demodulator of waves which have undergone dual-state phase-shift modulation. The upper surface of its acoustic-wave device constitutes the essential part of the demodulator and is indicated only diagrammatically. FIG. 5 shows an equivalent electric circuit diagram of the arrangement of FIG. 4 with, in particular, the connections to the other circuits of the demodulator indicated.

The device shown in FIG. 4 comprises a bidirectional input transducer 24, with one electrode connected to the input 25 of the demodulator and the other electrode connected to ground. The four output transducers 26 to 29 are similar to the transducer 3 of FIG. 1. The comb of the transducer 24 is more than twice the length of those of the output transducers 26 to 29, and it feeds four paths to the transducers 26 to 29 respectively.

The distance $L_o$ between the transducers 24 and 26 is such that $L_o = v\tau$, the distance $L_1$ between the transducers 24 and 27 is such that $L_1 = v(\tau + T)$, the distance $L_2$ between the transducers 24 and 28 is such that $L_2 = v(\tau + 2T)$, and the distance $L_4$ between the transducers 24 and 29 is such that $L_4 = v(\tau + 4T)$.

In the equivalent circuit diagram, shown in FIG. 5, there is a delay line 30 whose delay corresponds to the propagation time of the acoustic waves between the transducers 24 and 26, a delay line 31 whose delay $\tau + T$ corresponds to the propagation time between the transducers 24 and 27, a delay line 32 whose delay $\tau +$ 2T corresponds to the propagation time between the transducers 24 and 28 and a delay line 33 whose delay $\tau$ + 4T corresponds to the propagation time between the transducers 24 and 29. The delay lines 30 to 33 each have their inputs connected to the input 25. The output 34 of the delay line 30 corresponds to the output electrode of the transducer 26, just as the output 35 of the delay line 31 corresponds to that of the transducer 27, the output 36 of the delay line 32 corresponds to that of the transducer 28 and the output 37 of the delay line 33 corresponds to that of the delay line 29. All the elements described up to now form part of the acoustic-wave device and are included in a block outlined by a dashed line 38. It should be noted that the equivalent circuit diagram shows the various ground connections, which exist in the actual device.

The output 34 of the delay line 30 is connected in parallel to first inputs of mixers 39 to 41, whose second inputs are respectively connected to outputs 35 to 37 of delay lines 31, 32 and 33. The outputs of the mixers 39 to 41 are connected to the inputs of a decoding circuit 42, whose three outputs 43, 44 and 45 are connected to a decision making circuit 46 whose output 47 constitutes the output of the demodulator.

The demodulator shown in FIGS. 4 and 5 is used to restore a train of digital data which, before the modulation of the carrier, is coded by transition in relation to a preceding binary element. During demodulation, the information concerning each binary element is contained in a phase jump $\phi$, which can be expressed as:

$$\phi = \theta_i - \theta_{i-1}$$

where $\theta_i$ represents the phase of the carrier at the moment $i$, but which can also be expressed as:

$$\phi = (\theta_i - \theta_{i-2}) - (\theta_{i-1} - \theta_{i-2})$$

or again:

$$\phi = (\theta_i - \theta_{i-4}) - (\theta_{i-1} - \theta_{i-4})$$

The device 38, in association with the mixers 39 to 41, makes it possible to obtain the three items of information $\theta_i - \theta_{i-1}$, $\theta_i - \theta_{i-2}$ and $\theta_i - \theta_{i-4}$, while the last two $\theta_{i-1} - \theta_{i-2}$ and $\theta_{i-1}$ are calculated in circuit 42 from the preceding binary elements retained in the circuit 42.

It will be apparent that this circuit makes it possible to obtain, for each binary element, three estimates of the phase jump which are delivered at the outputs 43, 44 and 45 of the decoding circuit 42. The circuit 46 detects a majority among these three estimates.

The interesting point about the demodulator shown in FIGS. 4 and 5 is that it leads to demodulation performances comparable to those obtained by coherent demodulation. This demodutator avoids the recovery of the carrier frequency and it presents an advantage in comparison with the demodulator in FIGS. 1 or 2. On the other hand, it is obvious that such a demodulator would be of prohibitive bulk if it were made with cables serving as delay lines.

FIGS. 6 and 7 relate to a differential demodulator of waves which have undergone quadri-state phase-shift modulation, FIG. 6 providing a diagrammatic representation of the surface of a substrate of an acoustic-wave device. FIG. 7 illustrates the equivalent electrical circuit of the arrangement of FIG. 6.

The device shown in FIG. 6 includes a bidirectional input transducer 47 and three output transducers 48, 49 and 50. A fourth transducer 51 is not directly used in the demodulator but absorbs the waves emitted in its direction by the transducer 47. The transducer 47 is similar to the transducer 24 and feeds four paths.

A distance $L_o$ between transducer 47 and transducer 48 is such that $L_o = v\tau$, a distance $L_1$ between transducer 47 and transducer 49 is such that $L_1 = v(\tau + T)$ and a distance $L_2$ between transducer 47 and transducer 50 is such that $L_2 = v(\tau + T + (1/4fi))$. The distance between transducers 47 and 51 is immaterial. Again T represents the repetition period of the digital train which was used to modulate the wave applied to input 52 of transducer 47, while $fi$ is the frequency of the carrier.

In quadri-state phase-shift modulation, it is necessary, in order to achieve complete demodulation, to determine two trigonometric lines instead of just one, as in the case of dual-state phase modulation.

Referring now to the equivalent diagram shown in FIG. 7 of the arrangement of FIG. 6, we have a delay line 53 whose delay $\tau$ corresponds to the propagation time between transducers 47 and 48, a delay line 54 whose delay $\tau + T$ corresponds to the propagation time between transducers 47 and 49 and a delay line 55 whose delay $\tau + T + (1/4fi)$ corresponds to the propagation time between transducers 47 and 50. The delay lines 53 to 55 each have their inputs connected to the input 52. The output 56 of the delay line 53 is connected in parallel to the first inputs of mixers 57 and 58, the other inputs of which are respectively connected to outputs 59 of delay line 54 and 60 of delay line 55. The output of the mixer 57 delivers an initial even train while the output of mixer 58 delivers an initial odd train.

FIGS. 8 and 9 relate to a multi-differential demodulator of waves which have undergone quadri-state phase-shift modulation by a digital train. A differential demodulation is the same type that is encountered in connection with the exemplary embodiment shown in FIGS. 4 and 5. As in the demodulator shown in FIGS. 6 and 7, it is necessary to determine two trigonometric lines by angle. FIG. 8 is a diagrammatic representation of the surface of a substrate of an acoustic-wave device and FIG. 9 is the equivalent electric circuit diagram thereof.

The device shown in FIG. 8 consists of a bidirectional input transducer 84 and seven output transducers 83, 61, 62, 63, 64, 65 and 66. The transducer 84 feeds eight paths, of which seven are used.

The distance $L_o$ between transducers 84 and 83 is such that $L_o = v\tau$, the distance $L_1$ between transducers 84 and 61 is such that $L_1 = v(\tau + T)$, the distance $L_1'$ between transducers 84 and 62 is such that $l_1' = v(\tau + T + (1/4fi))$, the distance $L_2$ between transducers 84 and 63 is such that $L_2 = v(\tau + 2T)$, the distance $L_2'$ between transducers 84 and 64 is such that $L_2' = v(\tau + 2T + (1/4fi))$, the distance $L_3$ between transducers 84 and 65 is such that $L_3 = v(\tau + 4T)$, and the distance $L_3'$ between transducers 84 and 66 is such that $L_3' = v(\tau + 4T + (1/4fi))$. The letters T and $fi$ have the same meanings as described with reference to FIG. 6.

In the equivalent diagram in FIG. 9, there is shown a delay line 68, whose delay $\tau$ corresponds to the propagation time between transducers 84 and 83. A delay line 69 has a delay $\tau + T$ which corresponds to the propagation time between transducers 84 and 61. A delay line 70 has a delay $\tau + T + (1/4fi)$ which corresponds to the propagation time between transducers 84 and 62. A delay line 71 has a delay $\tau + 2T$ which corresponds to the propagation time between transducers 84 and 63. A delay line 72 has a delay $\tau + 2T + (1/4f)$ which corresponds to the propagation time between transducers 84 and 64. A delay line 73 has a delay $\tau + 4T$ which corresponds to the propagation time between transducers 84 and 65. A delay line 74 has a delay $\tau + 4T + (1/4f)$ which corresponds to the propagation time between transducers 84 and 66. The output of delay line 68 is connected in parallel to the first inputs of mixers 75 to 80, the second inputs of which are respectively connected to the outputs of delay lines 69 to 74. The outputs of mixers 75 to 80 are connected to the inputs of a decoding circuit 81 which combines the functions of circuit 42 shown in FIG. 5. On the one hand, the outputs of the mixers 75, 77 and 79 deliver an initial even train. On the other hand, the outputs of the mixers 76, 78 and 80 deliver an initial odd train. The output of decoding circuit 81 is processed in a decision making circuit 82, which is similar to circuit 46 shown in FIG. 5.

The figures which have just been described are not, of course, to scale. Furthermore, when the expression "binary elements" is used in the description of the figures, it must be understood to mean "waves modulated by a binary element."

The foregoing exemplary embodiments, which have been the subject of experiments, lead to excellent results and have performances closer to the theoretical performances than are those obtained with coherent demodulators.

Although the principles of the present invention have been described with reference to particular embodiments, by way of example, it is to be understood that the description does not limit the scope of the invention.

We claim:

1. A differential demodulator for electrical waves which are phase-shift-modulated responsive to a digital pulse train, said demodulator including an input, an output, an elastic-surface-wave means, an input transducer means formed on said elastic-surface-wave means, the input transducer means being connected to the input of the demodulator, mixer means having first and second inputs and an output, and an output transducer means, the output transducer means being connected to the first input of the mixer means, the second input of the mixer means being connected to the input of the demodulator and the output of the mixer means being connected to the output of the demodulator and path means including the elastic-surface-wave means interposed between the input transducer and the output transducer, the length of the said path means being determined by the repetition frequency of the train.

2. A differential demodulator for electrical waves which have undergone dual-state phase-shift modulation responsive to a digital pulse train, said demodulator including an input, an output, an elastic-surface-wave means, an input transducer means on the elastic-surface-wave means, the input transducer means being connected from the input of the demodulator, mixer means having first and second inputs and an output, and first and second output transducer means on the elastic-surface-wave means, the input transducer means launching elastic-surface-waves along a first path toward the said first output transducer means and along a second path toward the said second output transducer means, the first output transducer means being connected to the first input of the mixer means, and the second output transducer means being connected to the second input of the mixer means, the output of the mixer means being connected to the output of the demodulator, the difference in length between the first and second paths being determined according to the inverse of the digital pulse train repetition frequency.

3. A differential demodulator for electrical waves which have undergone dual-state phase-shift modulation responsive to a digital pulse train, said demodulator including an input, an output, an elastic-surface-wave means, an input transducer means on the elastic-surface-wave means, the input transducer means being connected to the input of the demodulator, $n$ mixer means each having first and second inputs, and $n$ output transducer means on the elastic-surface-wave means, the input transducer launching elastic-surface-waves along $n$ paths respectively toward said $n$ output transducer means, each of the $n$ output transducer means being respectively connected to the first inputs of the said $n$ mixer means, the demodulator input being connected in parallel to the second inputs of the said $n$ mixer means, decoding circuit means having a plurality of inputs, the outputs of the said $n$ mixer means being connected to corresponding inputs of said decoding circuit means, decision circuit means, means for connecting the output of said decoding means to said decision making circuit means, the output of said decision circuit means being the output of the demodulator, the respective lengths of the said $n$ paths being different multiples of a length determined according to the inverse of the pulse repetition frequency of said digital pulse train, whereby multidifferential demodulation of the waves applied to the demodulator input is obtained.

4. A differential demodulator for electrical waves which have undergone dual-state phase-shift modulation responsive to a digital pulse train, said demodulator including an elastic-surface-wave means, an input transducer means on said elastic-surface-wave means, $n + 1$ paths defined by the elastic-surface-wave means, $n + 1$ output transducer means on the elastic-surface-wave means, said input transducer means projecting surface waves along the $n + 1$ paths, the $n + 1$ paths being of different lengths, the differences in length between the shortest path and the other paths being different multiples of a length determined by the repetition frequency of the digital pulse train, mixer means, a decoding circuit means, the output of the $n + 1$ output transducers being connected to the input of said decoding means via said mixer means, decision making circuit means, the output of the decoding circuit being connected to the input of the decision making circuit means, whereby multidifferential demodulation of the waves applied to the demodulator is obtained.

5. A differential demodulator for electrical waves which have undergone quadri-state phase-shift modulation responsive to a digital pulse train means, said demodulator including an input transducer means on an elastic-surface-wave means, at least first and second paths defined by the elastic-surface-wave means, the input transducer means projecting surface waves along the first and second paths, the first path having a length determined by the repetition frequency of the digital pulse train and the second path having a length which is greater than that of the first path by an amount which is related to a quarter of the inverse of a carrier frequency of the modulated wave, a first output transducer means associated with the first path, a first mixer means having first and second inputs and an output, the first input of the first mixer means being connected to the first transducer means, the second input of the first mixer means being connected to the input of the demodulator, the output of the demodulator thereby delivering an even train, a second output transducer means associated with the second path and a second mixer means having first and second inputs and an output, the first input of the second mixer means being connected to the second output transducer means and the second input of the second mixer means being connected to the input of the demodulator, the output of the demodulator thereby delivering an odd train.

6. A differential demodulator for electrical waves which have undergone quadri-state phase-shift modulation responsive to a digital pulse train, said demodulator including an elastic-surface-wave means, an input transducer means and first, second and third output transducer means on the elastic-surface-wave means, first, second and third paths defined by the elastic-surface-wave means, said input transducer means projecting surface waves along the three paths, the first output transducer means being associated with the first path, first mixer means having first and second inputs, second mixer means, having first and second inputs, the first output transducer means being connected to the first input of the first mixer means and to the first input of the second mixer means, the second transducer means being associated with the second path and being connected to the second input of the first mixer means and the third output transducer means being associated with the third path and being connected to the second input of the second mixer means, the first mixer means delivering an even train and the second mixer means delivering an odd train, the difference in length between the first and the second paths being determined according to the repetition frequency of the digital pulse train and the difference in length between the second and third paths being related to a quarter of the inverse of the carrier frequency of the modulated wave.

7. A differential demodulator for electrical waves which have undergone quadri-state phase-shift modulation responsive to a digital pulse train, said demodulator including an elastic-surface-wave means, an input transducer means and $2n + 1$ output transducers means on the elastic-surface-wave means, $2n + 1$ paths defined by the elastic-surface-wave means, said input transducer means projecting surface waves along the said $2n + 1$ paths, $2n$ mixer means each having first and second inputs and an output, decoding circuit means, decision making circuit means, the first output transducer means being associated with the first path and being connected to the first inputs of the $2n$ mixer means, the lengths of the even numbered paths differing from that of the first path by multiples of a length determined by the repetition frequency of the digital pulse train and the lengths of all except the first of the odd numbered paths being respectively different from those of the even numbered paths by an amount related to a quarter of the inverse of the carrier frequency of the modulated wave, the mixer means having second inputs respectively connected from the last $2n$ output transducer means and having outputs connected to the input of the decoding circuit means, and the output of the decoding circuit means being applied to the decision making circuit means in order to achieve multidifferential demodulation.

* * * * *